US011928410B1

(12) United States Patent
Mano et al.

(10) Patent No.: US 11,928,410 B1
(45) Date of Patent: Mar. 12, 2024

(54) FORMAL ANALYSIS METHODS FOR DEBUG COMPILATION

(71) Applicant: Cadence Design Systems, Inc., San Jose, CA (US)

(72) Inventors: Stefano Mano, Carmo do Cajuru (BR); Yumi Monma, Belo Horizonte (BR)

(73) Assignee: Cadence Design Systems, Inc., San Jose, CA (US)

( * ) Notice: Subject to any disclaimer, the term of this patent is extended or adjusted under 35 U.S.C. 154(b) by 222 days.

(21) Appl. No.: 17/316,097

(22) Filed: May 10, 2021

(51) Int. Cl.
*G06F 30/33* (2020.01)
*G06F 30/12* (2020.01)

(52) U.S. Cl.
CPC .............. *G06F 30/33* (2020.01); *G06F 30/12* (2020.01)

(58) Field of Classification Search
CPC .................................. G06F 30/33; G06F 30/12
See application file for complete search history.

(56) References Cited

U.S. PATENT DOCUMENTS 5,867,399 A * 2/1999 Rostoker .......... G01R 31/31704
714/E11.167
8,584,063 B1 * 11/2013 Feng ..................... G06F 30/398
716/136

FOREIGN PATENT DOCUMENTS

CN 114764551 A * 7/2022

* cited by examiner

*Primary Examiner* — Rehana Perveen
*Assistant Examiner* — Cuong V Luu
(74) *Attorney, Agent, or Firm* — Schwegman Lundberg & Woessner, P.A.

(57) ABSTRACT

Methods and systems are disclosed for optimizing compilation efforts for design debug based on formal analyses. The method includes accessing a circuit design, automatically determining a segment as being a design region of interest, identifying a behavior within the segment for performing at least one verification test, compiling the segment without compiling a remainder of the circuit design, and providing performance indicators corresponding to the behavior within the segment based on the segment as compiled.

15 Claims, 5 Drawing Sheets

FORMAL ANALYSIS METHODS FOR DEBUG COMPILATION

TECHNICAL FIELD

The present disclosure generally relates to the technical field of circuit design. In particular, the present disclosure provides for formal analysis for debug compilation of circuit designs.

BACKGROUND

An integrated circuit (IC) layout specifies portions of various components of an IC. Electronic Design Automation (EDA) tools allow circuit designers to define constraints on the objects in a circuit design, such as transistors, wires, and logic. A constraint is associated with one or more design objects, and may represent relationships among design objects. For example, in the context of the EDA domain, constraints are ordinarily associated with design objects, such as devices, pins, terminals, instance terminals, and interconnect wires, to represent design parameters for the design objects, and to represent relationships or requirements imposed by the design specification on the objects.

Integrated circuits are used for a wide variety of electronic applications, from simple devices to complex computer systems. An integrated circuit chip can be thought of as a collection of logic cells with electrical interconnections between the cells, formed on a semiconductor substrate. An IC may include a very large number of cells and require complicated connections between the cells. A cell is a group of one or more circuit elements such as transistors, resistors, capacitors, inductors, and other basic circuit elements grouped together to perform a logic function.

An IC chip is fabricated by first conceiving the logical circuit description, and then converting the logical circuit description into a physical description, or geometric layout. This process is usually carried out using a "netlist" which is a record of all of the nets, or interconnections, between the cell pins. A layout typically consists of a set of planar geometric shapes in several layers. The layout is then checked to ensure it meets all of the design requirements, particularly timing requirements. The result is a set of design files known as an intermediate form that describes the layout. The design files are then converted into pattern generator files that are used to produce patterns called masks by an optical or electron beam generator.

The IC design process entails various operations. Some of the physical-design operations that EDA applications commonly perform to obtain the IC layouts are: (1) circuit partitioning, which partitions a circuit if the circuit is too large for a single chip; (2) floor planning, which finds the alignment and relative orientation of the circuit modules; (3) placement, which determines more precisely the positions of the circuit components; (4) routing, which completes the interconnects between or among the circuit components; and (5) verification, which checks the layout to ensure that it meets design and functional requirements.

In addition to circuit partitioning, floor planning, placement and routing, a typical EDA IC design process may include one or more optimization operations during which design objectives such as slew, timing, power, and other considerations are improved. Optimization often involves performing one or more formal verification tests and updating the circuit based at least in part on the results of the verification tests. Traditional compilation efforts require heavy computation and is resource intensive.

With the increasing complexity of circuit design technology, concepts such as constraint-driven, connectivity-driven, and design rule-aware layout have been adopted by EDA tools in both the integrated circuit and printed circuit board domains. This capability, allows designers to encode and respect design constraints at various stages of design flow, ensure correct connectivity, and prevent design rule errors automatically.

Conventional methods include compiling the circuit design, reviewing DRV, compilation errors, updating the circuit design, and recompiling. This process may take hours, even days for compiling large circuit designs. The constant compiling and recompiling present a unique technical challenge. Compilation requires a lot of a computing device's resources and may take a lot of time. The technical solution described herein allows for compiling of a specified portion of the circuit design, saving processing time and resources.

Traditional methods may include performing formal design verification tests pertaining to a specific behavior or set of components and compiling the entire design to verify the design complies and passes the design verification tests. Such formal design verification tests are typically used to check whether the design is performing and/or behaving as expected by testing the circuit properties known as assertions and covers. An assertion checks that a given statement (e.g., logic statement) is true, and a cover checks to determine that a behavior is true for at least one of valid states.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

Various ones of the appended drawings merely illustrate example embodiments of the present inventive subject matter and cannot be considered as limiting its scope.

DETAILED DESCRIPTION

Figure 1:
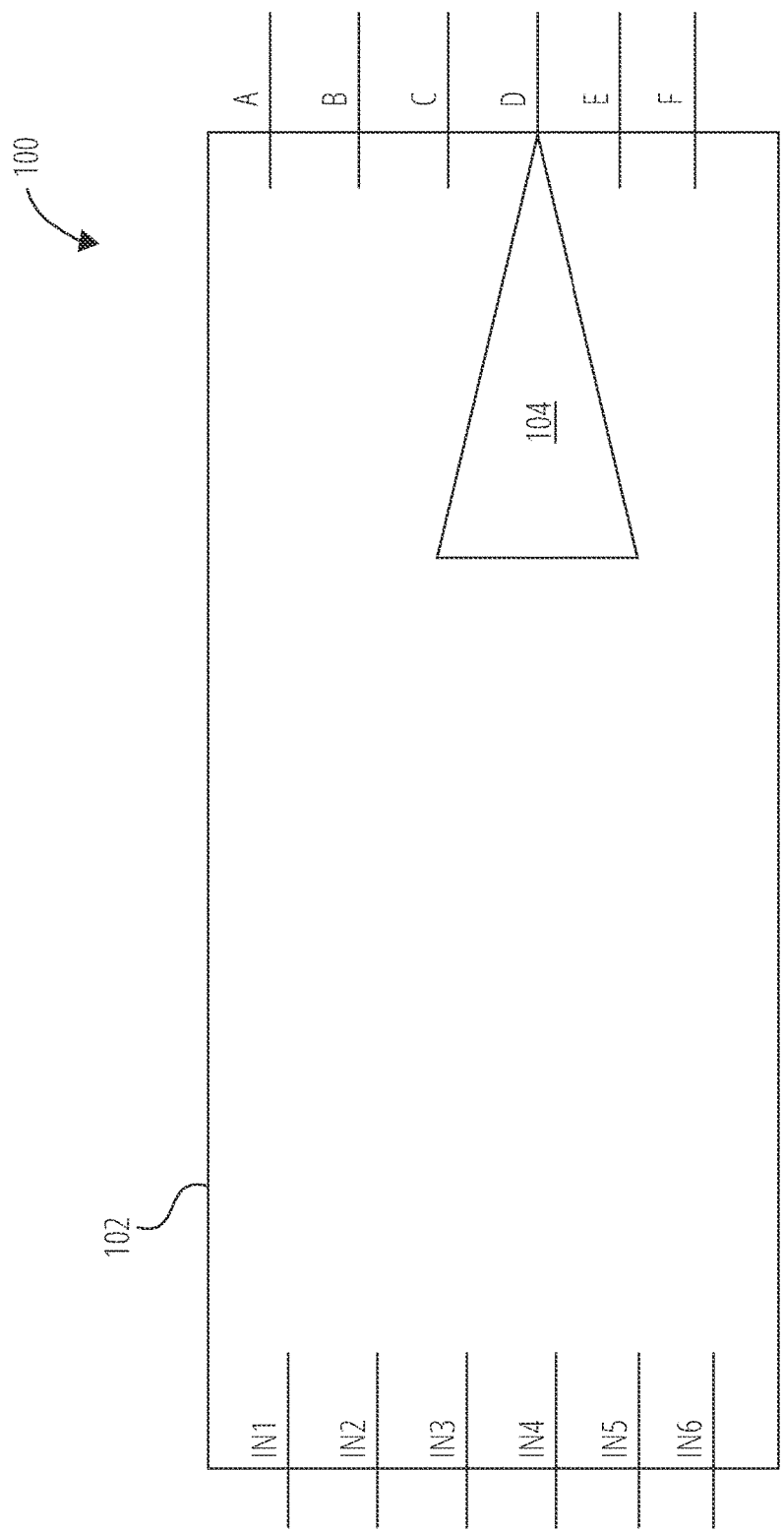
FIG. 1 is an example diagram showing a view of a circuit design for behavior analysis in accordance with some embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Contrary to traditional approaches, the methods and systems disclosed herein can perform design verification tests on a portion of a circuit design. Instead of compiling and recompiling the entire design, by determining a portion or even a sub-portion that is less than all of the circuit design, that is of a particular interest, debug and verification tests and operations can be performed on the portion without disturbing the rest of the circuit design. Additionally, the methods and systems disclosed herein can reduce the processing power and time that it takes to compile the entire design.

Consistent with some embodiments, a method may include accessing a circuit design, automatically determining, a segment as being a design region of interest, identifying a behavior within the segment for performing at least one verification test, compiling the segment without compiling a remainder of the circuit design, and providing performance indicators corresponding to the behavior within the segment based on the segment as compiled.

As described herein, methods and systems provide a technical solution considering a specified design region of interest as being the design region for compilation, rather than compiling the entire circuit design. By identifying and compiling the selected portion of the circuit design, optimization efforts can be concentrated and focused on the selected portion of the design without concern for the remainder of the circuit design. Various verification tests and analyses can be performed on the selected portion of the circuit design without affecting the remainder of the circuit design.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least sonic of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

FIG. 1 is an example diagram showing a view of a circuit design for behavior analysis in accordance with some embodiments.

Diagram 100 includes a view of a design 102 with various inputs (e.g., IN1, IN2, IN3 . . . :IN6) and various outputs (e.g., A, B, C . . . F). As shown, the diagram 100 includes the design 102 with a sub-area 104 that is part of the design 102. In some embodiments, a designer is interested in a behavior of output D that includes components within sub-area 104. Components include logic, gates, pins, connectors, and other parts within a circuit design. For example, the output of D is influenced by various components (e.g., logic, multiplexers, inverters.) Instead of compiling the entire design 102, the example methods and systems described herein focus on compiling sub-area 104 without compiling the rest of design 102.

In some embodiments, the sub-area 104 is unknown. To determine the sub-area 104, a cone-of-influence (COT) analysis may be performed to determine the region of signals that influence the behavior of a desired signal (e.g., output signal). The COI analysis includes gathering the signals that are connected to the desired signal including all signals and elements that influence or affect the output. The COI analysis may also include a functional analysis to determine which signals and/or elements of the design 102 does not impact the desired signal (e.g., output signal D). By identifying the signals and components that are responsible for impacting the desired signal, the COI and/or functional analysis can provide the sub-area 104 as being the design region of interest. The remaining portions of the design 102 are not affected by the desired signal and in some embodiments will not be compiled and recompiled.

For example, when a designer wishes to debug a portion of a circuit design based on a specific behavior related to an output. The computing device performs a COI analysis to determine the portions of the circuit design that affect, or are affected by, the behavior. The computing device can then perform one or more verification tests on the portion of the circuit design that is affected by or affects the behavior.

In another example, a designer may verify that an unexpected behavior seen in the circuit design is fixed. Instead of compiling the entire design to determine whether the unexpected behavior has been addressed, or fixed, the methods and systems described herein can compile the portion of the design that has been fixed to determine if the design now behaves as expected.

Figure 2A:
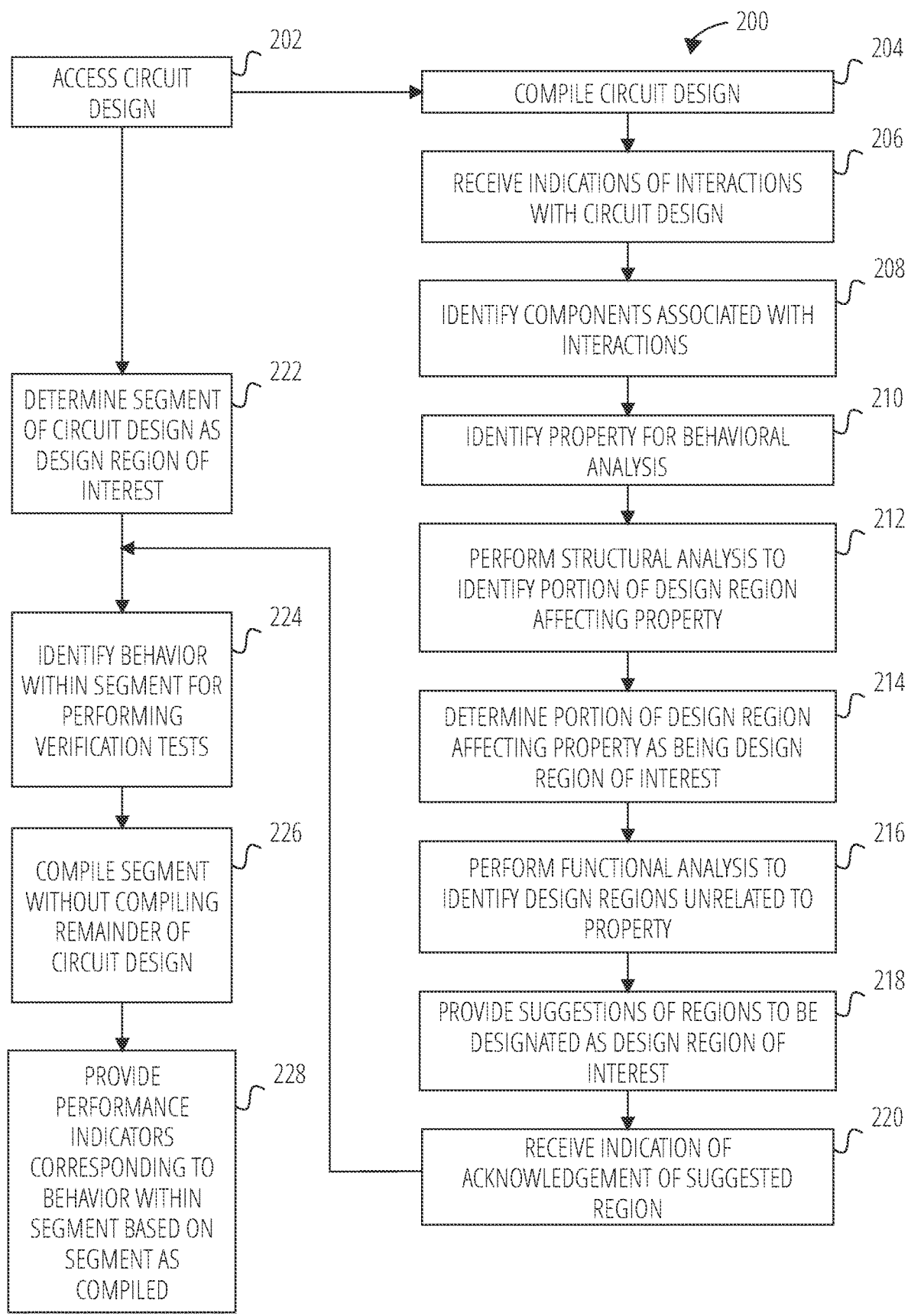
FIG. 2A is a flowchart illustrating an example method for performing optimized compilation for debug operations in accordance with some embodiments.
Figure 2B:
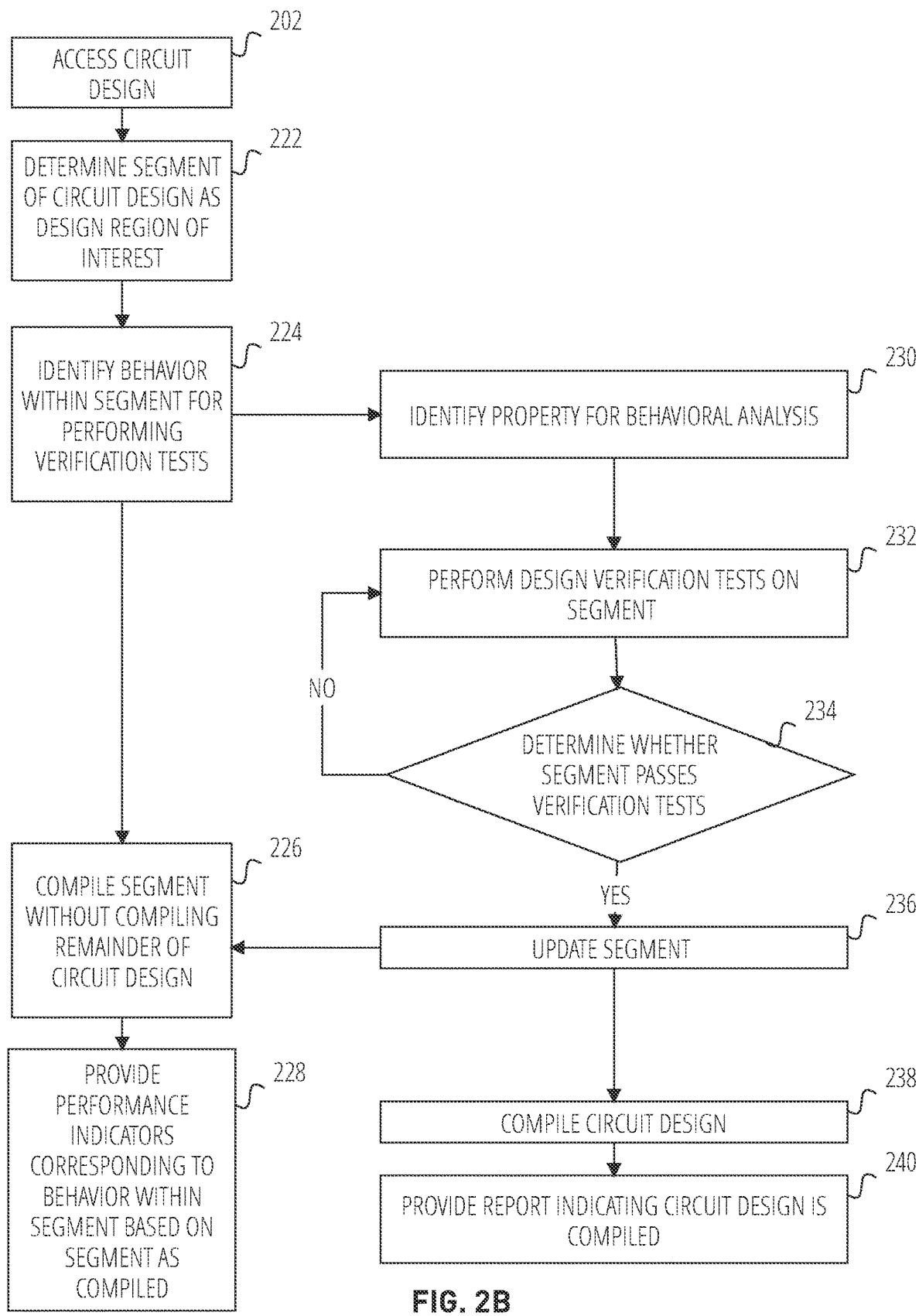
FIG. 2B is a flowchart illustrating detailed features and some of the method shown in flowchart FIG. 2A.

FIG. 2A is a flowchart illustrating an example method for performing optimized compilation for debug operations in accordance with some embodiments. FIG. 2B is a flowchart illustrating detailed features and some of the method shown in flowchart FIG. 2A.

It will be understood that the method 200 may be performed by a device, such as a computing device executing instructions of an EDA software system. For instance, the operations of a method 200 may be represented by executable instructions (e.g., EDA software) that, when executed by a processor of a computing device, cause the computing device to perform the method 200. Thus, an operation of the method 200 may be performed by a hardware processor (e.g., central processing unit or graphics processing unit) of a computing device (e.g., desktop, server, etc.). Accordingly, the method 200 is described below in reference to such a computing device. Additionally, the term "property" and "behavior" are used interchangeably herein.

Depending on the embodiment, an operation of the method 200 may be repeated in different ways or involve intervening operations not shown. Though the operations of the method 200 may be depicted and described in a certain order, the order in which the operations are performed may vary among embodiments, including performing certain operations in parallel. As described herein, a design component is a part, element, module, or other device that is used within a circuit design. A design component may have various properties such as a height, width, length, conductivity, that may affect the design component's behavior within a circuit design. A property corresponds to a singular design component and a behavior may be affected by a plurality of design components. The behaviors affect performance indicators that signify whether or not the components are configured in a way that is desired by the designer.

The method 200 begins at operation 202 where the computing device access a circuit design having one or more components and determines a segment within the circuit design as being a design region of interest (see operation 222). In some embodiments, at operation 204, the computing device compiles the circuit design. Typically, the circuit design has to be compiled at least once before the debug analysis may proceed. In some embodiments, the computing device receives indications of interaction with the circuit design (e.g., user interaction) at operation 206. In some embodiments, the computing device detects one or more user interactions with the circuit design and uses the user interactions with the circuit design and/or a specific component within the circuit design to determine a region or subregion of interest. In some embodiments, the user repeatedly interacts with a select or select few components. The repeated user interactions are used to determine the region or sub-region of interest.

The computing device then identifies the components associated with the interactions at operation 208 and identifies a property caused by the components for behavioral analysis at operation 210. For example, a user interacts with output D and signifies that an expected behavior at output D is a property in which behavioral analysis is to be applied. In another example, the user sends the computing device a request for a behavioral analysis to be performed on a property of the circuit design.

At operation 212, the computing device performs a structural analysis to identify portions of the circuit design that affects or is affected by the property. As shown in FIG. 1, only a sub-set of the circuit design may affect the property to be analyzed. Based on the structural analysis, the computing device determines a portion of the design region that affects the property as being the design region of interest (operation 214). Additionally, a functional analysis may be performed at operation 216 to identify design regions unrelated to the property. This functional analysis may be used as a sanity check to verify the design region of interest.

In some embodiments, the computing device automatically provides suggestions of regions to be designated as the design region of interest at operation 218. Additionally, the computing device may automatically determine the segment including the design region of interest based at least in part on a user interaction with a component of the circuit design. The provided suggestion may include the design region of interest determined by the preceding operations. In some embodiments, the computing device receives an indication of acknowledgement, or confirmation, of the suggested design region to be designated as the design region of interest (operation 220). In some embodiments, the computing device receives an indication that the suggestions are not selected. In such scenarios, the computing device may receive an alternate design region of interest (e.g., manually designated by a user).

The method 200 may proceed, as shown at operation 224, to identify a behavior within the segment for performing verification tests, compiling the segment without compiling the remainder of the circuit design, and providing performance indicators corresponding to behaviors within the segment based on the segment as compiled (see operations 208-228).

In FIG. 2B, additional operations of method 200 are disclosed that provide details corresponding to operations 224-226. The computing device accesses a circuit design (see operation 202), determines a segment of the circuit design as being the design region of interest (operation 222), and identifies a behavior within the segment for performing verification tests (see operation 224). In some embodiments, operation 224 of identifying a behavior within the segment for performing verification tests include operation 230 of identifying a property for behavioral analysis and performing one or more design verification tests on the segment for the behavioral analysis (see operation 232). At operation 234, it is determined whether the segment passes the verification tests based on the identified property for behavioral analysis. If yes, the segment is updated and/or saved as having passed verification tests (see operation 236). If no, one or more updates may be made to the circuit design within the design region of interest and the verification tests may be performed.

The operations 232 and 234 may be repeated until the segment passes the verification tests. After successful completion of the verification tests, at operation 226, the computing device may compile the segment without compiling the remainder of the circuit design and performance indicators corresponding to the behavior are provided at operation 228. Based at least in part on the performance indicators, the segment may be updated. Performance indicators can include various indicators of the behavior of the one or more components such as a signal strength, a logic output, a voltage, a current, connectivity, and other various indicators associated with circuit design. The performance indicators may provide an indication that the behavior of the components within the segment behave as expected. Alternatively, the performance indicators may provide an indication that the behavior of the components within the segment are not or do not behave as expected. Corresponding updates to the components within the segment may be made as part of a debug process. If the segment is updated, operations 232 and 234 may be repeated to determine whether the components of the segment are behaving as expected or desired.

In some embodiments at operation 238, the entire circuit design is compiled and a report indicating that the circuit design is compiled is provided at operation 240. It is understood that the operations of method 200 may be performed sequentially as shown and may be performed out of sequence, without performing one or more operations described, and/or by repeating one or more operations described herein.

Figure 3:
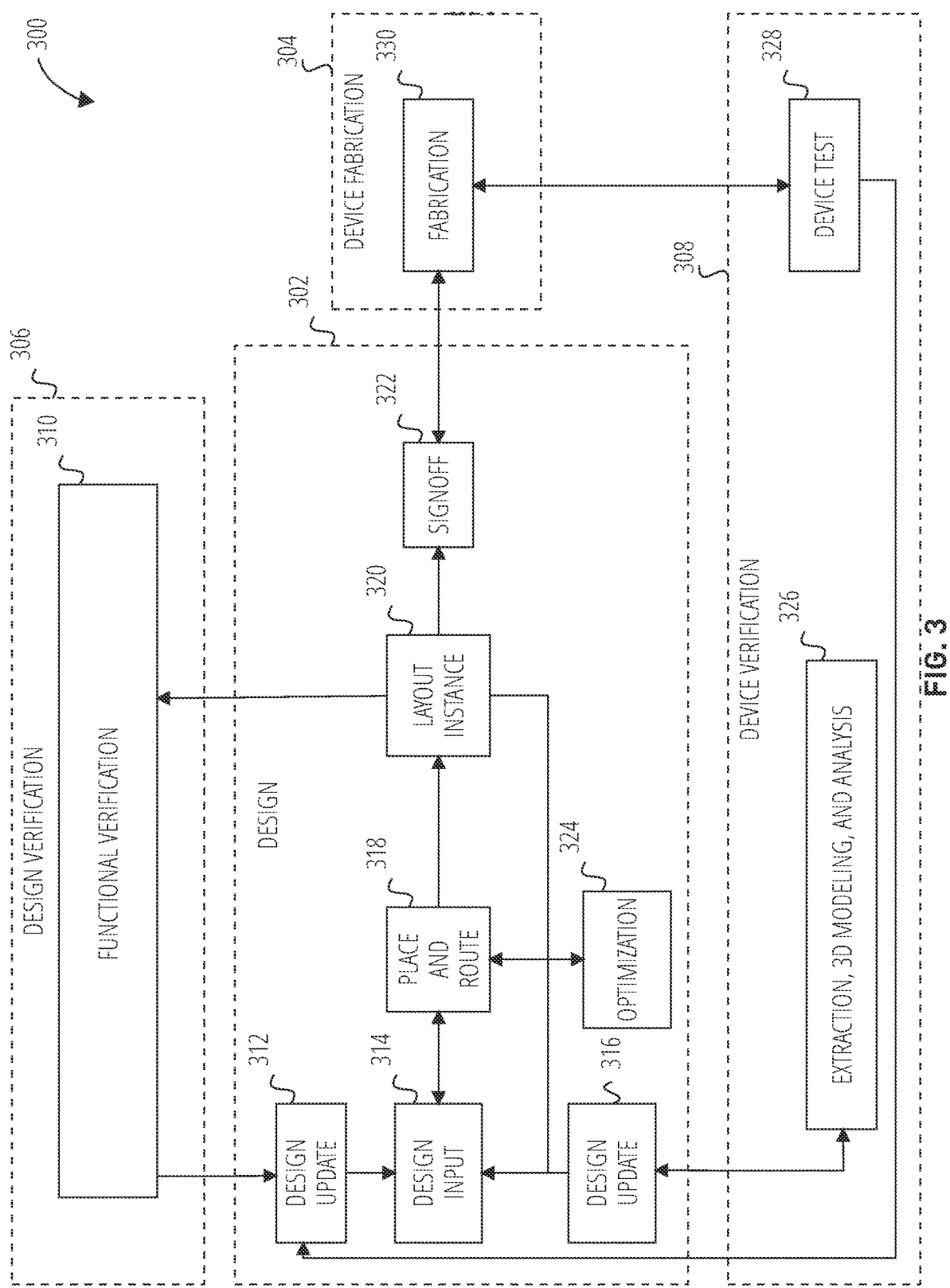
FIG. 3 is a diagram illustrating an example design process flow that includes optimizing compilation efforts for design debug in accordance with some embodiments.

FIG. 3 is a diagram illustrating an example design process flow 300 that includes optimizing compilation efforts for design debug in accordance with some embodiments. As shown, the design process flow 300 includes a design phase 302, a device fabrication phase 304, a design verification phase 306, and a device verification phase 308 The design phase 302 involves an initial design input 314 operation where the basic elements and functionality of a device are determined, as well as revisions based on various analyses and optimization of a circuit design. This design input 314 operation is where block instances are used in the circuit design and any additional circuitry for the design around the blocks is selected. The initial strategy, tactics, and context for the device to be created are also generated in the design input 314 operation, depending on the particular design algorithm to be used. In some embodiments, there is at least one associated verification process between each connection between design input 314 and optimization 324.

In some embodiments, following an initial selection of design values in the design input 314 operation, routing, placement, and timing analysis are performed in a place and route 318 operation, and optimization is performed in an optimization 324 operation along with any other automated design processes. While the design phase 302 shows a place and route 318 and optimization 324 occurring prior to a layout instance 320, routing, placement, timing analysis, and optimization may be performed at any time to verify operation of a circuit design.

During placement, exact locations are assigned to various components within an IC's core area. Further optimizations are often performed to fix timing and design rule violations in the design. EDA applications often include buffer insertion engines that insert buffers or inverters at exact locations while optimizing circuit characteristics according to design rules. A buffering engine takes a synthesized netlist together with a technology library and produces a placement layout.

Routing is generally divided into two phases: global routing and detailed routing. For each net, global routing generates a routing topology that includes an approximate routing path for the interconnect lines that are to connect the pins of the net. After the routing topology has been created, detailed routing creates specific individual routes for each net. Place- and- route is a typical stage in integrated circuit (IC) design. After place and route, a design rule violation (DRV) stage is often performed to fix DRVs (e.g., a maximum capacitance violation, a maximum fanout violation, or a maximum transition violation) in an IC design.

In some embodiments, following an initial selection of design values in the design input 314 operation, routing, placement, and timing analysis are performed in a place and route 318 operation, and optimization is performed in an optimization 324 operation along with any other automated design processes. While the design process flow 300 shows place and route 318 and optimization 324 occurring prior to a layout instance 320, routing, placement, timing analysis, and optimization may be performed at any time to verify operation of a circuit design.

For instance, in various embodiments, timing analysis in a circuit design may be performed prior to routing of connections in the circuit design, after routing, during register transfer level (RTL) operations, or as part of a signoff 322, as described below.

After design inputs are used in the design input 314 operation to generate a circuit layout, and any of the routing and optimization 324 operations are performed, a layout is generated in the layout instance 320. The layout describes the physical layout dimensions of the device that match the design inputs. Prior to this layout being provided to a fabrication 330 operation, the signoff 322 is performed on the circuit design defined by the layout.

After signoff verification by the signoff 322, a verified version of the layout is used in the fabrication 330 operation to generate a device, or additional testing and design updates may be performed using designer inputs or automated updates based on functional verification 310 operations or extraction, 3L) modeling, and analysis 326 operations. Once the device is generated, the device can be tested as part of device test 328 operations, and layout modifications generated based on actual device performance.

A design update 312 from the functional verification 310; a design update 316 from the device test 328 or the extraction, 3D modeling, and analysis 326 operations; or the design input 314 operation may occur after the initial layout instance 320 is generated. In various embodiments, whenever design inputs are used to update or change an aspect of a circuit design, a timing analysis and the routing and optimization 324 operation may be performed.

Figure 4:
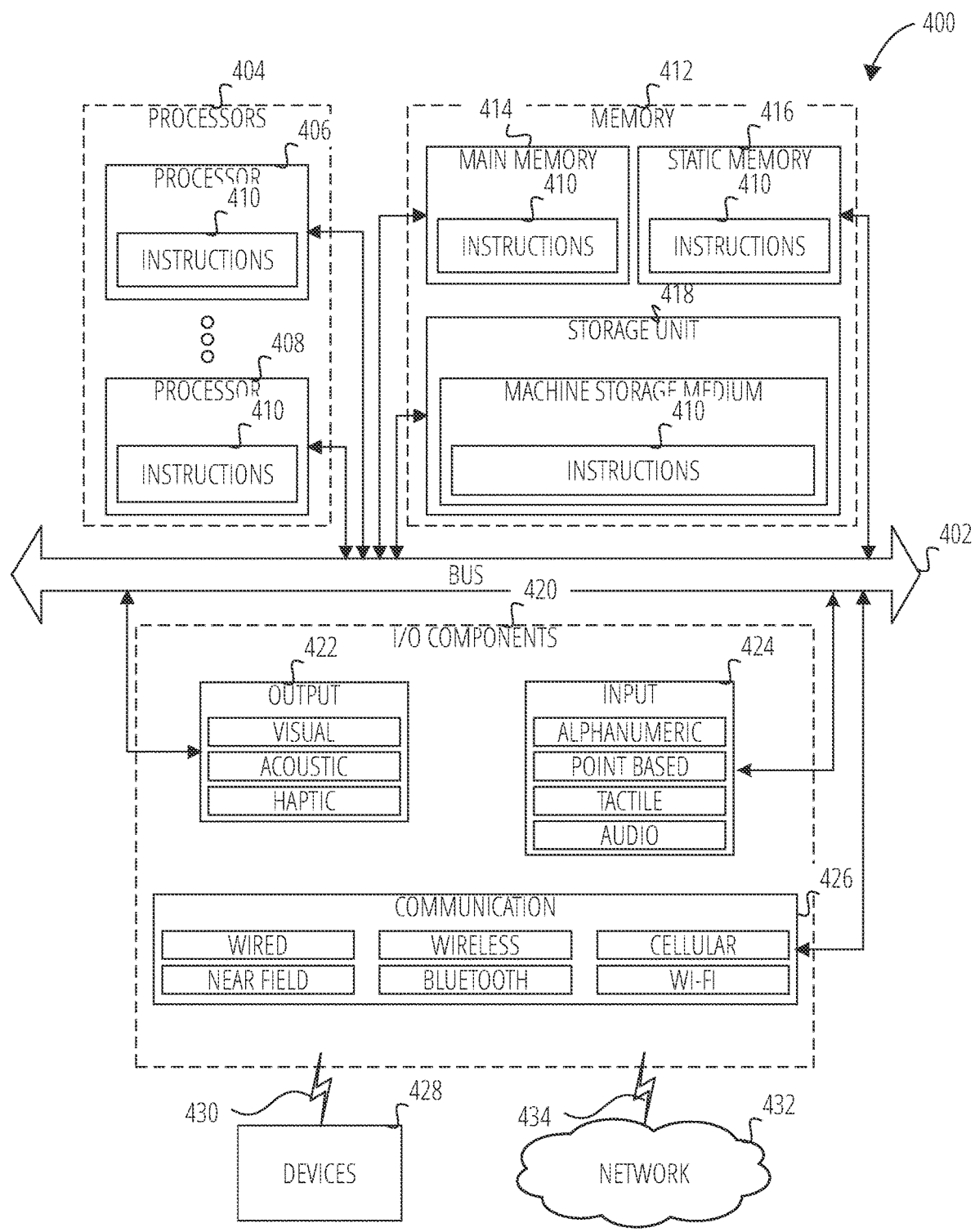
FIG. 4 is a diagrammatic representation of a machine in the example form of a computer system within which a set of instructions for causing the machine to perform any one or more of the methodologies discussed herein may be stored and executed.

FIG. 4 illustrates a diagrammatic representation of a machine 400 in the form of a computer system within which a set of instructions may be executed for causing the machine 400 to perform any one or more of the methodologies discussed herein, according to an example embodiment. Specifically, FIG. 4 shows a diagrammatic representation of the machine 400 in the example form of a computer system, within which instructions 410 (e.g., software, a program, an application, an apples, an app, or other executable code) for causing the machine 400 to perform any one or more of the methodologies discussed herein may be executed. For example, the instructions 410 may correspond to an EDA software system that causes the machine 400 to execute the method 200. Additionally, or alternatively, the instructions 410 may implement FIGS. 1 and 2A-2B. The instructions 410 transform the general, non-programmed machine 400 into a particular machine 400, such as an FDA system, programmed to carry out the described and illustrated functions in the manner described here. In alternative embodiments, the machine 400 operates as a standalone device or may be coupled (e.g., networked) to other machines. In a networked deployment, the machine 400 may operate in the capacity of a server machine or a client machine in a server-client network environment, or as a peer machine in a peer-to-peer (or distributed) network environment. The machine 400 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 410, sequentially or otherwise, that specify actions to be taken by the machine 400. Further, while only a single machine 400 is illustrated, the term "machine" shall also be taken to include a collection of machines 400 that individually or jointly execute the instructions 410 to perform any one or more of the methodologies discussed herein.

The machine 400 may include processors 404, memory 412, and I/O components 420, which may be configured to communicate with each other such as via a bus 402. In an example embodiment, the processors 404 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RTIC), another processor, or any suitable combination thereof) may include, for example, a processor 406 and a processor 408 that may execute the instructions 410. The term "processor" is intended to include multi-core processors 404 that may comprise two or more independent processors (sometimes referred to as "cores") that may execute instructions 410 contemporaneously. Although FIG. 4 shows multiple processors 404, the machine 400 may include a single processor with a single core, a single processor with multiple cores (e.g., a multi-core processor), multiple processors with a single core, multiple processors with multiple cores, or any combination thereof.

The memory 412 may include a main memory 414, a static memory 416, and a storage unit 418, both accessible to the processors 404 such as via the bus 402. The main memory 414, the static memory 416, and the storage unit 418 store the instructions 410 embodying any one or more of the methodologies or functions described herein. The instructions 410 may also reside, completely or partially, within the main memory 414, within the static memory 416, within the storage unit 418, within at least one of the processors 404 (e.g., within the processor's cache memory), or any suitable combination thereof, during execution thereof by the machine 400.

The I/O components 420 may include a wide variety of components to receive input, provide output, produce output, transmit information, exchange information, capture measurements, and so on. The specific I/O components 420 that are included in a particular machine will depend on the type of machine. For example, portable machines such as mobile phones will likely include a touch input device or other such input mechanisms, while a headless server machine will likely not include such a touch input device. It will be appreciated that the I/O components 420 may include many other components that are not shown in FIG. 4. The I/O components 420 are grouped according to functionality merely for simplifying the following discussion and the grouping is in no way limiting. In various example embodiments, the I/O components 420 may include output components 422 and input components 424. The output components 422 may include visual components (e.g., a display such as a plasma display panel (PDP), a light emitting diode (LED) display, a liquid crystal display (LCD), a. projector, or a cathode ray tube (CRT)), acoustic components (e.g., speakers), other signal generators, and so forth. The input components 424 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 420 may include communication components 426 operable to couple the machine 400 to a network 432. or devices 428 via a coupling 434 and a coupling 430, respectively. For example, the communication components 426 may include a network interface component or another suitable device to interface with the network 432. In further examples, the communication components 426 may include wired communication components, wireless communication components, cellular communication components, and other communication components to provide communication via other modalities. The devices 428 may be another machine or any of a wide variety of peripheral devices (e.g., a peripheral device coupled via a universal serial bus (USB)).

Executable Instructions and Machine Storage Medium

The various memories (e.g., 412, 414, 416, and/or memory of the processor(s) 406) and/or the storage unit 418 may store one or more sets of instructions and data structures (e.g., software) embodying or utilized by any one or more of the methodologies or functions described herein. These instructions, when executed by the processor(s) 404, cause various operations to implement the disclosed embodiments.

As used herein, the terms "machine-storage medium," "device-storage medium," "non-transitory computer readable storage medium," and "computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors, Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media, "computer-storage media," and "device-storage media" specifically exclude carrier waves, modulated data signals, and other such media, at least some of which are covered under the term "signal medium" discussed below.

Transmission Medium

In various example embodiments, one or more portions of the network 432 may be an ad hoc network, an intranet, an extranet, a virtual private network (VPN), a local-area network (LAN), a wireless LAN (ALAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 432 or a portion of the network 432 may include a wireless or cellular network, and the coupling 434 may be a Code Division Multiple Access (CDMA) connection, a Global System for Mobile communications (GSM) connection, or another type of cellular or wireless coupling. In this example, the coupling 434 may implement any of a variety of types of data transfer technology, such as Single Carrier Radio Transmission Technology (1×RTT), Evolution-Data Optimized (EVDO) technology, General Packet Radio Service (CPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Terni Evolution (LTE) standard, others defined by various standard-setting organizations, other long-range protocols, or other data transfer technology.

The instructions 410 may be transmitted or received over the network 432 using a. transmission medium via a network interface device (e.g., a network interface component included in the communication components 426) and utilizing any one of a number of well-known transfer protocols (e.g., hypertext transfer protocol (FITTP)). Similarly, the instructions 410 may be transmitted or received using a transmission medium via the coupling 430 (e.g., a peer-to-peer coupling) to the devices 428. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 410 for execution by the machine 400, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not "B but not A," and "A and unless otherwise indicated. In the appended claims, the terms "including" and "in which" are used as the plain-English equivalents of the respective terms "comprising" and "wherein." Also, in the following claims, the terms "including" and "comprising" are open-ended: that is, a system, device, article, or process that includes elements in addition to those listed after such a term in a claim is still deemed to fall within the scope of that claim.

What is claimed is:

1. A system, comprising:
one or more processors of a machine; and
a computer-readable medium storing instructions, which, when executed by the machine, cause the machine to perform operations comprising:
    accessing a circuit design stored in memory, the circuit design comprising one or more design components and a plurality of segments each segment comprising a region of the circuit design;
    receiving one or more indications of a user interaction with the circuit design;
    identifying a design component of the circuit design associated with the user interaction;
    receiving, from a user, a request for behavioral analysis of a property of the design component of the circuit design;
    in response to the request:
        performing structural analysis of the circuit design to identify a segment of the plurality of segments that at least one affects the property or is affected by the property; and
        determining the segment as being a design region of interest;
    identifying a behavior within the segment for performing at least one verification test;
    compiling the segment without compiling a remainder of the circuit design; and
    providing, for display to the user, one or more performance indicators corresponding to the behavior within the segment based on the segment as compiled.

2. The system of claim 1, wherein the operations comprise:
providing a suggestion of one or more regions to be designated as being the design region of interest.

3. The system of claim 1, wherein the operations comprise:
updating the segment in accordance with the one or more performance indicators; and
recompiling the segment without compiling the remainder of the circuit design.

4. The system of claim 1, wherein the operations comprise:
performing one or more design verification tests on the segment; and
in response to a determination that the segment passes design verification:
compiling the circuit design; and
providing a report indicating that the circuit design has been compiled.

5. The system of claim 1, wherein the operations comprise:
providing a suggestion of one or more regions to be designated as being the design region of interest;
receiving a confirmation from the user to designate an individual region of the one or more regions as being the design region of interest; and
determining the individual region as being the design region of interest.

6. A method comprising:

accessing, by one or more processors of a machine, a circuit design stored in memory, the circuit design comprising one or more design components and a plurality of segments each segment comprising a region of the circuit design;

receiving, by the one or more processors, one or snore indications of a user interaction with the circuit design;

identifying, by the one or more processors, a design component of the circuit design associated with the user interaction;

receiving from a user, by the one or more processors, a request for behavioral analysis of a property of the design component of the circuit design;

in response to the request:
  performing, by the one or more processors, structural analysis of the circuit design to identify a segment of the plurality of segments that at least one affects the property or is affected by the property; and
  determining, by the one or more processors, the segment as being a design region of interest;

identifying, by the one or more processors, a behavior within the segment for performing at least one verification test;

compiling, by the one or more processors, the segment without compiling a remainder of the circuit design; and providing, by the one or more processors, one or more performance indicators for display to the user, the one or more performance indicators corresponding to the behavior within the segment based on the segment as compiled.

7. The method of claim 6, wherein the determining of the segment being the design region of interest includes:

providing a suggestion of one or more regions to be designated as being the design region of interest;

receiving a confirmation from the user to designate an individual region of the one or more regions as being the design region of interest; and determining the individual region as being the design region of interest.

8. The method of claim 6, comprising:

updating the segment in accordance with the one or more performance indicators; and recompiling the segment without compiling the remainder of the circuit design.

9. The method of claim 6, comprising:

performing one or more design verification tests on the segment; and in response to a determination that the segment passes design verification:

compiling the circuit design; and providing a report indicating that the circuit design leas been compiled.

10. The method of claim 6, comprising:

providing, by the one or more processors, a suggestion of one or more regions to be designated as being the design region of interest.

11. A non-transitory computer-readable storage medium, the computer-readable storage medium including instructions that when executed by a computer, cause the computer to perform operations comprising:

accessing a circuit design stored in memory;

receiving one or more indications of a user interaction with the circuit design, the circuit design comprising one or more design components and a plurality of segments, each segment comprising a region of the circuit design;

identifying a design component of the circuit design associated with the user interaction;

receiving, from a user, a request for behavioral analysis of a property of the design component of the circuit design;

in response to the request:
  performing structural analysis of the circuit design to identify a segment of the plurality of segments that at least one affects the property or is affected by the property; and
  determining the segment of the circuit design as being a design region of interest;

identifying a behavior within the segment for performing design at least one verification test;

compiling the segment without compiling a remainder of the circuit design; and providing, for display to the user, one or more performance indicators corresponding to the behavior within the segment based on the segment as compiled.

12. The non-transitory computer-readable storage medium of claim 11, wherein the operations comprise:

performing one or more design verification tests on the segment; and in response to a determination that the segment passes each of the one or more design verification tests:

compiling the circuit design; and providing a report indicating that the circuit design has been compiled.

13. The non-transitory computer-readable storage medium of claim 11, wherein the operations comprise:

providing a suggestion of one or more regions to be designated as being the design region of interest.

14. The non-transitory computer-readable storage medium of claim 11, wherein the operations comprise:

providing a suggestion of one or more regions to be designated as being the design region of interest:

receiving a confirmation from the user to designate an individual region of the one or more regions as being the design region of interest; and determining the individual region as being the design region of interest.

15. The non-transitory computer-readable storage medium of claim 11, wherein the operations comprise:

updating the segment in accordance with the one or more performance indicators; and recompiling the segment without compiling the remainder of the circuit design.

* * * * *